United States Patent Office 2,846,295

Patented Aug. 5, 1958

2,846,295

ETCHING BATH

Robert G. Patterson, Westbury, and Yoshikazu Yamada, Garden City Park, N. Y., assignors to Mergenthaler Linotype Company, a corporation of New York No Drawing. Application January 27, 1958
Serial No. 711,171

19 Claims. (Cl. 41—42)

This invention relates to etching baths useful in the production of metallic relief plates and to a method of etching light-exposed relief plates for use in printing.

The metal plates used in non-planographic reproduction processes when ready for use contain in relief the image which is to be printed. In letterpress printing the ink is transferred from the raised portions of the printing surface, just as in printing with ordinary type. In gravure or intaglio printing, the ink is transferred to the paper from the depressed portions of the printing surface. The plates used in these processes are collectively termed engraved or relief printing plates herein. In such plates, the formation of the relief image in the plate requires an etching step, which naturally is an essential part of the procedure for preparation of the plate.

The plates employed are of metal, usually of zinc or magnesium alloy, and are coated with a photosensitive resist composition which initially is soluble in certain solvents or solvent solutions used for subsequent development after exposure but when exposed to light this coating becomes insoluble in such solutions. Thus, during development of a coated plate which has been exposed to light through a photo-mechanical negative or positive, the opaque areas of the negative or positive through which light did not pass are washed out because they remain soluble in the developer, exposing the naked metal base of the plate in such areas, while the rest of the plate remains coated. These bare areas correspond with the outlines of the image, and, depending on whether the image is a negative or a positive, after etching either will become the image itself or will define the image.

The next step is to etch the bare surface of the metal in such areas so as to form the image in relief. Nitric acid is generally used for etching zinc and magnesium alloy plates. It is essential that the edges of the image be sharp and well defined if the final plate is to print the image cleanly. However, the etching process is difficult to control, because it proceeds wherever bare metal lies exposed to the acid. Thus, as the etching process continues, the etching solution etches not only deeper into the plate but also deeper into the edges of the image. Such sidewise etching is called lateral attack, and may result in undercutting or in a widening of the etch at the top, or both. Since lateral attack at the top of the etch changes the physical size outline of the image itself, it is of course to be avoided, if at all possible. It has therefore been the object of the art for many years to reduce the lateral attack of acid etching solutions, but it cannot be said that any of the methods suggested are entirely successful.

To indicate the extent of lateral attack upon the plate in photoengraving the term "etch factor" has been introduced. The etch factor is a measure of the degree of lateral attack by the etching bath. It is the ratio of the depth of the etch, measured along a line perpendicular to the resist to the deepest part at the edge of the etch, to the average loss in width of metal on that side of the image, measured laterally at the top of the surface of the metal beneath the line of the resist. The etch factor is expressed by the formula $$e.f.=\frac{\text{depth}\times 2}{\text{lateral loss}}$$

The customary way to minimize lateral attack is to etch in small "bites," using a series of etching steps. In the first etch, after a slight relief has been built up, the plate is removed from the etching solution, washed and dried, and a resin or wax, or both, then applied to the edges of the relief image. A natural resin, such as dragon's blood, or a synthetic resin, or a synthetic product, such as a mixture of wax, resin and aniline dye, usually are used. These are melted or "banked" into the lateral areas by holding the plate over a hot flame. The plate when immersed a second time in the etching bath now will be protected from lateral attack to a certain extent by the coating of the resin. However, it is apparent that this procedure has many disadvantages. The resin coating must be carefully applied, so as not to adhere to the areas of the plate which must be etched still deeper. Moreover, in a short time, as the etch deepens, more bare areas subject to lateral attack are exposed, so that the protective coating loses its value, and a new coating is needed. Thus, a new "bank-in" or "burn-in" follows. An etch of the normal depth may require 4 to 7 etches and "bank-ins" or "burn-ins" of this type. Approximately 66 minutes is required for preparation of a plate using 4 "burn-ins."

The time and labor thus required to produce deep etches constitutes a considerable nuisance to the trade, and many efforts have been made to overcome the necessity of using dusting powders. Such efforts have led to the proposal that there be included in the acid bath certain agents which coat upon the metal an acid-resistant film which tends to protect the surface of the metal from acid attack during the etching process. Since the etching bath completely covers the area to be etched, however, so also does the removable acid-resistant film that is deposited from the etching bath. Unless deposition is controlled, the film therefore may slow down the etch not only in the areas where lateral attack may take place but also in the areas which it is desired to etch. The problem thus becomes one of controlling the extent of deposition of the acid-resistant film, and the nature and stability of the film that is formed, so that a proper film is deposited in the areas where lateral attack is to be prevented, but is not deposited sufficiently in the areas to be etched. In this ideal situation, the film would prevent lateral attack but would not materially inhibit etching where desired.

This ideal is, however, quite difficult to realize. The extent of deposition and the nature and stability of the acid-resistant film are dependent upon the material used for the film, upon the stability of its dispersion in the acid etching bath, and upon the degree of circulation of the fluid etching medium.

Obviously, the dispersion cannot be completely stable, since then no film would be deposited. On the other hand, the dispersion cannot be too unstable, since then the film would be formed unevenly. The nicety of adjustment of the stability of the dispersion is a serious problem, dependent as it is upon the nature of the film material and upon the emulsifying agent used in the bath to form the dispersion.

Another method of controlling the extent of deposition, as stated, is by the customary artificial circulation of the etching bath media. The theory of this is that the more open areas of the etch will receive the greatest amount of circulation, because they are open, while the edges and corners of the open areas, where lateral attack occurs, will receive less circulation, and therefore a larger amount of the film which is deposited will be retained on the metal surface in such areas, slowing the etch more there. Unfortunately, however, there is much fine detail in a relief plate in relatively enclosed areas, such as the centers of letters—g's, a's, o's, e's, and the like. In these areas, circulation alone is not adequate to give a good etch since it is very easy for the film-forming agent to be deposited uniformly there, and to remain there despite circulation. Hence, the rate of etch may be slower here than elsewhere. In these areas, since circulation of the etching bath is not adequate for a good etch, the only factors which come into play are the relative effectiveness of the film-forming agent, and the stability of the dispersion of the film-forming agent in the etching bath. These factors, as previously stated, are quite difficult to control, and it has not yet been possible to do so to obtain an adequate etch in such enclosed areas.

Several U. S. patents, dated June 2, 1953, have issued to Easley and Swayze, disclosing various types of film-forming agents which can be used to exert a protective coating action against lateral attack by the etching bath. No. 2,640,763 suggests the use of saturated aliphatic acids having from five to twenty-six carbon atoms. No 2,640,764 suggests the use of esters of aliphatic acids having from twelve to eighteen carbon atoms and polyhydric aliphatic alcohols having from two to six carbon atoms. No. 2,640,765 uses water-immiscible organic materials liquid at ordinary temperatures or liquefied below the temperature at which the etching bath is normally used, and substantially unreactive with the nitric acid solution, esters of sulfosuccinic acid and an aliphatic alcohol having from four to twelve carbons. As illustrative, it suggests the various petroleum fractions boiling in the range of 90 to 390° C., including kerosene, coal oil, benzine, gasoline, and lubricating oils. No. 2,640,766 utilizes esters of sulfosuccinic acid and an aliphatic alcohol having from four to twelve carbon atoms. No. 2,640,767 utilizes petroleum oil fractions boiling in the range of 90° to 93° C., as does No. 2,640,765, with a petroleum sulfonate in order to assist in dispersing the petroleum oil.

These patents treat etch factor as though it were the only criterion of the optimum etch. The etch factor is not adequate to define the actual printability of the finished plate. The angle of the side wall of the image which is optimum for printability has been established at 11° from the perpendicular, facing down, which itself limits the possible depth of etch in the counter areas. The etch factor does not take this optimum angle into account. Also, for optimum printability, there are optimum depths of etch for various areas of the plate, depending upon the extent of their enclosure.

Moreover, none of these patents appreciates the significance of the stability of the emulsion in the control of the rate of etch in the enclosed areas of the plate. Although wetting agents are used in Nos. 2,640,765 and 2,640,767, each of the wetting agents which are employed itself has film-forming properties. The sulfosuccinic acid esters are themselves capable of minimizing lateral attack, and are the subject of No. 2,640,766. According to No. 2,640,767, the petroleum sulfonates and the petroleum oil fractions together act to reduce the etching action of the acid. Thus, the function of each of the wetting agents employed in these patents is also to reduce the rate of etch by the formation of this film, and the differential control needed to prevent lateral attack is obtained by the agitation of the etching solution during the etching. This is not adequate, for the reasons stated, to obtain a satisfactory rate of etch while preventing lateral attack in the areas of the plate which are relatively protected due to their small dimensions, such as the interiors of the letters a, o, g, e, and the like.

In order to obtain an increase in the rate of etch in the enclosed areas, it is necessary to add an anti-film-forming material, such as gelatin, to these baths.

In accordance with Serial No. 614,336, filed October 8, 1956, of which this application is a continuation-in-part, an etching bath is provided which substantially eliminates lateral attack by the etching solution, and yet at the same time gives the desired depth development throughout all of the areas of the plate, according to their configuration, or the extent to which they are open or enclosed. The etching bath of that invention does not materially slow the rate of etch. The nitric acid etching bath of that invention includes a petroleum hydrocarbon fraction as the film-forming agent and an alkyl sulfate having fourteen atoms as the principal surfactant with a 1,1,4,4-tetraalkyl-2-butyne-1,4-diol as an optional additional surfactant. This bath is based upon the principle that the stability of the emulsion and the nature and stability of the film formed on the surface of the metal are each quite significant, and are controlled by the surfactant.

In accordance with the instant invention, it has been determined that the etching baths described and claimed in Serial No. 614,336 can be further improved, so as to impart a better base buildup and sidewall configuration to the plate, by incorporating therein an alkyl aryl sulfonate.

The nature and stability of the film formed upon the metal surface are very difficult to measure, and equally difficult to control. Here, the nature of the surfactant and of the film each play a part. Heretofore, such factors have not been taken into account in controlling the rate of etch and the extent of lateral attack. They are utilized in the etching bath of the invention to overcome the difficulties attending use of prior baths of the film-forming type in obtaining a satisfactory depth of etch in enclosed areas while minimizing lateral attack.

The etching baths of the invention contain as the film-forming agent a water-immiscible petroleum hydrocarbon fraction which is substantially nonvolatile under the etching conditions, that is, at the temperature of the etching bath. It should therefore having a minimum boiling point in the range of 70 to 90° C. There is no upper limit on the maximum boiling point, but as their boiling point increases, petroleum fractions tend to become more viscous, and accordingly more difficult to disperse in aqueous suspensions and maintain in uniform suspension throughout the etching time. The upper limit therefore is established by the viscosity and ease of dispersion or emulsibility of the petroleum hydrocarbon employed, and will usually be about 390° C. Aliphatic, aromatic and cycloaliphatic fractions can be used, as well as mixtures thereof, for example, kerosene, gasoline, benzine, coal oil and lubricating oil fractions. Various aromatic hydrocarbons and chlorinated aromatic hydrocarbons, for example, the diethyl benzenes, also can be used. Turpentine is useful, as well as chlorinated aliphatic hydrocarbons such as perchloroethylene.

As the nonfilm-forming surfactant there is employed an alkyl sulfate having fourteen carbon atoms, i. e., a tetradecyl sulfate $C_{14}H_{29}SO_4M$, where M is a metal cation, preferably an alkali metal, e. g., sodium or potassium or ammonium. The preferred compound is sodium 7-ethyl-2-methyl-undecane-4-sulfate,

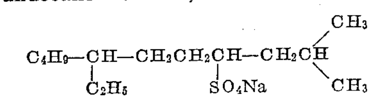

available as a 25% aqueous solution. This substance has a remarkable effect upon the film-forming properties of the film-forming agent. Addition of the petroleum hydrocarbon alone to the etching bath has only a slight effect on the etch factor. When the proper amount of the sodium 7-ethyl-2-methyl-undecane-4-sulfate is added, the etch factor can be increased by as much as ten times.

The etching baths in accordance with the invention also contain a substituted 1,1,4,4-tetraalkyl-2-butyne-1,4-diol nonionic surfactant. These are defined by the general formula

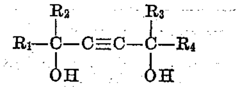

where $R_1$ and $R_4$ are selected from the group consisting of alkyl radicals having from four to fourteen carbon atoms, for example, butyl, decyl, lauryl, and palmityl, and $R_2$ and $R_3$ are selected from the group consisting of alkyl radicals having from one to five carbon atoms, for example, methyl, ethyl, propyl, butyl, and amyl. These substances are available in commerce under the trademark Surfynol.

The following are illustrative of compounds which have been tried in the etching baths of the invention, and have been found very satisfactory:

5,8-dimethyl-6-dodecyne-5,8-diol

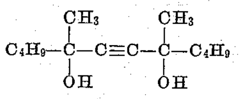

13,16-dimethyl-14-octacosyne-13,16-diol

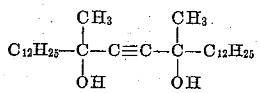

15,18-dimethyl-16-dotriacontyne-15,18-diol

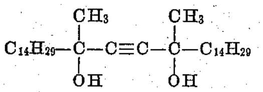

These nonionic surfactants have the effect of increasing the rate and character of etch in the presence of the tetradecyl sulfate, when the amount of the latter is low, so that they also tend to improve the action of the etching bath in the enclosed areas, such as the centers of small letters, so that these reach an adequate depth of etch at the same time as do the larger more open areas. With this, they also further reduce lateral attack to approximately nil.

The alkyl aryl sulfonates are defined by the general formula

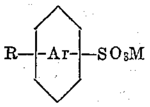

where R is a hydrocarbon radical having, or a plurality of hydrocarbon radicals aggregating, from two to about eighteen carbon atoms, preferably from four to sixteen carbon atoms,

is an aromatic carbocyclic ring nucleus having from six to ten carbon atoms such as a benzene or naphthalene nucleus, and M is hydrogen or an alkali metal, e. g., sodium, potassium, or ammonium or an organic amine cation, e. g., from triethanolamine, diethanolamine or other strongly basic organic amines.

R can, for example, include straight or branched aliphatic groups such as butyl, methyl, propyl, hexyl, octyl, heptyl, nonyl, decyl, hendecyl, dodecyl, tridecyl, tetradecyl and octadecyl radicals, and cyclic hydrocarbon radicals such as phenyl.

These substances are available in commerce under the trade names Parnol 85 (sodium dodecyl benzene sulfonate), Ultrawet K (sodium dodecyl benzene sulfonate), Oronite (sodium phenyl polypropylene sulfonate, see Lewis Patent No. 2,477,383), Sorbit P (sodium butyl naphthalene sulfonate), Immersol TX (sodium butyl naphthalene sulfonate), Nacconol (keryl benzene sulfonate), Ninex 303 (sodium xylene sulfonate), Aresklene (dibutyl phenyl phenol sodium disulfonate), Aresket (monobutyl biphenyl sodium sulfonate) and Areskap (monobutyl phenyl phenol sodium sulfonate). The commercial grades containing sulfate are quite satisfactory.

The etching baths of the invention are surprisingly sensitive to the amounts of the wetting agents.

The tetradecyl sulfate should be in an amount within the range from 0.2 to 2.5% by weight of the nitric acid, calculated as $HNO_3$. Amounts within the range from 0.2 to 0.8% by weight are preferred. The etching bath has little or no inhibiting effect upon lateral attack when the tetradecyl sulfate is present in an amount less than 0.2%. On the other hand, in amounts in excess of 2.5%, etching may be inhibited or prevented.

The amount of the 2-butyne nonionic surfactant is somewhat less critical. In fact, it can be omitted, if desired. When used, it will be in an amount within the range from 0.05 to 2.5% by weight of the nitric acid, calculated as $HNO_3$.

It has been observed that the amount of the 2-butyne surfactant which should be used should be in proportion to the tetradecyl sulfate such that the ratio of the 2-butyne surfactant to tetradecyl sulfate is not in excess of 1.5 and preferably at least 0.025. Thus, the amount of the 2-butyne surfactant will be selected from within the range of 0.05 to 2.5% by weight of the nitric acid, keeping in mind this ratio. The preferred range is from 0.05 to 1.2% by weight of the nitric acid.

The alkyl aryl sulfonate is used in an amount within the range from 0.015 to 0.75%, preferably from 0.02 to 0.45% by weight of the nitric acid, calculated as 100% $HNO_3$. The base buildup and sidewall configuration of the etched plate are not improved when the alkyl aryl sulfonate is present in an amount less than 0.015%. On the other hand, in amounts in excess of 0.75% etching is considerably inhibited, and the enclosed areas are not attacked.

The above amounts are based upon the amount of nitric acid in the bath, because the rate of etch itself depends upon the acid concentration, and these additives are added to control the rate of etch in selected areas. Hence, the amount of wetting agent used will always depend upon the acid concentration, calculated as $HNO_3$ (100% $HNO_3$).

The etching bath of the invention is a dispersion or emulsion of the film-forming agent in the aqueous acid solution with the aid of the wetting agents. It is important that the etching bath emulsion not be too stable. If the emulsion is too stable, the protective film which it is desired to form on the surface of the metal will not be formed, or if formed, it will not give sufficient control of the etch in the desired areas. Hence, the amounts of wetting agent will be selected from the above ranges to give an emulsion which fully separates into two layers, constituting the aqueous layer and the petroleum hydrocarbon fraction layer, within from ½ to 1½ minutes after stirring is stopped.

The petroleum hydrocarbon fraction may be used in an amount in a more extended range, and the amount is not critical, but would be used in proportion to the desired effect. The range would usually be within from 1 to 75% by volume of the nitric acid solution, preferably from 5 to 25%. Factors to be taken into consideration are the type of metal used, the depth of the etch, the type of etch, that is, the size type and the character of the image, and the concentration.

The concentration of the acid will be dependent upon the metals constituting the plate, as those skilled in the art are aware. The range will be from 3 to 25% by weight of the solution in most cases. For magnesium and magnesium alloy plates the nitric acid solution preferably will be approximately 7.5 to 13% in strength, while for zinc plates, the nitric acid solution preferably will be about 7.5 to 20%.

The etching bath also can contain antifoaming agents, such as silicone resin emulsions, to reduce foam. However, when the 2-butyne nonionic surfactant is present, antifoamers are unnecessary.

The types of photosensitive resists which can be used on printing plates are of course limited, and the organic petroleum hydrocarbon which is employed will be selected with a view to avoiding attack upon the resist. The diethyl benzenes, for example, are good solvents for the sensitized polyvinyl cinnamic acid esters which are the subject of U. S. Patents Nos. 2,610,120, 2,670,285, 2,690,966, 2,670,287, and 2,739,892. Consequently, when resists of this type are being employed, kerosene and the aliphatic petroleum hydrocarbons are preferable. On the other hand, diethyl benzene can be used with other types of resists, such as the bichromated colloid resists.

The following examples in the opinion of the inventors represent the best embodiments of their invention.

EXAMPLE 1

An etching bath was prepared of the following composition:

| | Volume, ml. | Active Amount (g.) | Percent by Weight Based on 100% $HNO_3$ |
|---|---|---|---|
| Nitric Acid (42° Baumé) | 350 | 331 | |
| Kerosene | 170 | | |
| Sodium 7-ethyl-2-methyl-undecane-4-sulfate (25% aqueous solution) | 3.75 | 0.983 | 0.297 |
| Surfynol 104E [1] (50% solution in ethylene glycol by weight) | 1.25 | 0.613 | 0.185 |
| Water to make | 1,870 | | |

[1] A mixture of predominantly 13,16-dimethyl-14-octacosyne-13,16-diol and 15,18-dimethyl-16-dotriacontyne-15,18 diol.

A sensitized zinc alloy plate (zinc alloyed with aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table I*

| Line | Width of Line Before Etching (Inch) | Width of Line After Etching (Inch) | Loss (Inch) | Depth (Inch) | Etch Factor |
|---|---|---|---|---|---|
| A1 | 0.0708 | 0.0697 | 0.0011 | 0.0134 | 24.4 |
| A2 | 0.0699 | 0.0692 | 0.0007 | 0.0132 | 37.9 |
| A3 | 0.0718 | 0.0709 | 0.0009 | 0.0133 | 29.6 |
| B1 | 0.0751 | 0.0731 | 0.0020 | 0.0134 | 13.4 |
| B2 | 0.0722 | 0.0714 | 0.0008 | 0.0132 | 34.0 |
| B3 | 0.0723 | 0.0713 | 0.0010 | 0.0135 | 27.0 |

The edges of the etch were clean and free from undercutting. There was good base buildup below the image.

To the above bath, which was not exhausted, was added 1 ml. of Ninex 303 (sodium xylene sulfonate, 40% active). An identical plate was prepared and etched with this bath, with the following results:

*Table II*

| Line | Width of Line Before Etching (Inch) | Width of Line After Etching (Inch) | Loss (Inch) | Depth (Inch) | Etch Factor |
|---|---|---|---|---|---|
| A1 | 0.0721 | 0.0715 | 0.0006 | 0.0131 | 43.7 |
| A2 | 0.0719 | 0.0714 | 0.0005 | 0.0132 | 52.8 |
| A3 | 0.0721 | 0.0717 | 0.0004 | 0.0133 | 66.5 |
| B1 | 0.0716 | 0.0711 | 0.0005 | 0.0133 | 53.2 |
| B2 | 0.0716 | 0.0712 | 0.0004 | 0.0128 | 64.0 |
| B3 | 0.0727 | 0.0721 | 0.0006 | 0.0129 | 63.0 |

The improvement in etch factor is apparent. The edges of the etch were clean and free from undercutting. The base buildup was excellent, and the sidewalls were of optimum configuration, superior to that of the plate etched with the first bath.

EXAMPLE 2

An etching bath was prepared of the following composition:

| | Volume, ml. | Active Amount (g.) | Percent by Weight Based on 100% $HNO_3$ |
|---|---|---|---|
| Nitric Acid (42° Baumé) | 350 | 331 | |
| Kerosene | 170 | | |
| Sodium 7-ethyl-2-methyl-undecane-4-sulfate (25% aqueous solution) | 3.75 | 0.903 | 0.297 |
| Surfynol 104E [1] (50% solution in ethylene glycol by weight) | 1.25 | 0.613 | 0.185 |
| Water to make | 1,850 | | |

[1] A mixture of predominantly 13,16-dimethyl-14-octacosyne-13,16-dio and 15,18-dimethyl-16-dotriacontyne-15,18 diol.

A sensitized zinc alloy plate (zinc alloyed with aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table III*

| Line | Width of Line Before Etching (Inch) | Width of Line After Etching (Inch) | Loss (Inch) | Depth (Inch) | Etch Factor |
|---|---|---|---|---|---|
| A1 | 0.0724 | 0.0718 | 0.0006 | 0.0136 | 44.0 |
| A2 | 0.0725 | 0.0713 | 0.0012 | 0.0134 | 22.3 |
| A3 | 0.0732 | 0.0724 | 0.0008 | 0.0137 | 34.2 |
| B1 | 0.0727 | 0.0721 | 0.0006 | 0.0137 | 46.2 |
| B2 | 0.0724 | 0.0716 | 0.0008 | 0.0138 | 36.5 |
| B3 | 0.0737 | 0.0729 | 0.0008 | 0.0039 | 36.8 |

The edges of the etch were clean and free from undercutting. There was good base buildup below the image.

To the preceding bath, which was not exhausted, was added 43 ml. of a 1.3% solution of Nacconol NR (a keryl benzene sulfonate which had been extracted with alcohol to free it from sulfate). The solution was used to etch a developed zinc alloy plate as before. The etch depth and lateral loss were as shown in the table below:

*Table IV*

| Line | Width of Line Before Etching (Inch) | Width of Line After Etching (Inch) | Loss (Inch) | Depth (Inch) | Etch Factor |
|---|---|---|---|---|---|
| A1 | 0.0725 | 0.0723 | 0.0002 | 0.0128 | 128 |
| A2 | 0.0721 | 0.0719 | 0.0002 | 0.0130 | 130 |
| A3 | 0.0731 | 0.0728 | 0.0003 | 0.0129 | 86.0 |
| B1 | 0.0725 | 0.0723 | 0.0002 | 0.0126 | 126 |
| B2 | 0.0726 | 0.0723 | 0.0003 | 0.0131 | 87.3 |
| B3 | 0.0734 | 0.0731 | 0.0003 | 0.0129 | 86.0 |

The improvement in etch factor is very significant. The lateral loss was reduced to one-third or less after the addition of the Nacconol. The base buildup was excellent and the sidewalls were of optimum configuration, superior to that of the plate etched with the first bath. The edges of the etch were clean and free from undercutting.

EXAMPLE 3

An etching bath was prepared of the following formulation:

| | Volume | Active Amount (g.) | Percent by Weight Based on 100% $HNO_3$ |
|---|---|---|---|
| Nitric Acid (42° Baumé) | 8.5 l. | 8,030 | |
| Kerosene | 5.0 l. | | |
| Sodium 7-ethyl-2-methyl-undecane-4-sulfate (25% aqueous solution) | 82.5 ml. | 21.64 | 0.269 |
| Surfynol 104E (50% solution in ethylene glycol by weight) | 13.49 ml. | 6.75 | 0.168 |
| Water to make | 76 l. | | |

This bath was used to etch a magnesium alloy plate, the alloy being primarily magnesium with 2% aluminum and 1% zinc with a trace of cadmium, coated with a resist in accordance with the example of U. S. Patent No. 2,610,120, consisting essentially of a polyvinyl cinnamic acid ester, sensitized with a small amount of 2,4,6-trinitroaniline. The plate was exposed through a negative containing line images at 3½ feet from a 75 ampere white flame carbon arc for about 2 minutes, and developed in methyl ethyl ketone to remove the unexposed soluble resist areas. The plates were scummed out in dilute nitric acid, rinsed and then etched in a 76 liter Dirats etching machine for a total of 5 minutes.

A second bath was prepared having the following formulation:

| | Volume | Active Amount (g.) | Percent by Weight Based on 100% $HNO_3$ |
|---|---|---|---|
| Nitric Acid (42° Baumé) | 8.5 l. | 8,030 | |
| Kerosene | 3.0 l. | | |
| Sodium 7-ethyl-2-methyl-undecane-4-sulfate (25% aqueous solution) | 60.8 ml. | 15.94 | 0.199 |
| Surfynol 104E (50% solution in ethylene glycol by weight) | 36.5 ml. | 17.90 | 0.223 |
| Rueterg 97-S [1] | 27.8 ml. | 12.79 | 0.158 |
| Water to make | 76 l. | | |

[1] Monoethanolamine dodecyl benzene sulfonate, 88% active, diluted 1:1 water to 44% active. Density of Rueterg 97-S diluted, 1.045.

The bath was used to etch a magnesium alloy plate as before.

The etch factor was greatly improved, due to the addition of the Rueterg 97-S. The base buildup was excellent and the sidewalls were of optimum configuration, superior to that of the plate etched with the first bath. The edges of the etch were clean and free from undercutting.

EXAMPLE 4

An etching bath was prepared of the following composition:

| | Volume (ml.) | Active Amount (g.) | Percent by Weight Based on 100% $HNO_3$ |
|---|---|---|---|
| Nitric Acid (42° Baumé) | 350 | 331 | |
| Water | 1,860 | | |
| Kerosene | 170 | | |
| Sodium 7-ethyl-2-methly-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table V*

| Lateral Loss in Line Width (Inch) | Etch Depth (Inch) | Etch Factor |
|---|---|---|
| 0.0007 | 0.0135 | 38.6 |
| 0.0008 | 0.0133 | 33.3 |
| 0.0007 | 0.0132 | 37.7 |
| 0.0011 | 0.0134 | 24.4 |
| 0.0008 | 0.0132 | 33.0 |
| 0.0007 | 0.0133 | 38.0 |

The edges of the etch were clean and free from undercutting. There was good base buildup below the image.

To the above bath, which was not exhausted, was added 11 ml. of a 5% aqueous solution of Aresket 300 (monobutyl biphenyl sodium sulfonate, 100% active). An identical plate was prepared and etched with this bath, with the following results:

*Table VI*

| Lateral Loss in Line Width (Inch) | Etch Depth (Inch) | Etch Factor |
|---|---|---|
| 0.0003 | 0.0142 | 94.7 |
| 0.0004 | 0.0141 | 70.5 |
| 0.0002 | 0.0139 | 139 |
| 0.0004 | 0.0137 | 68.5 |
| 0.0005 | 0.0138 | 55.2 |
| 0.0003 | 0.0136 | 90.7 |

The improvement in etch factor is apparent. The edges of the etch were clean and free from undercutting. The base buildup was excellent and the sidewalls were of optimum configuration, superior to that of the plate etched with the first bath.

EXAMPLE 5

An etching bath was prepared of the following composition:

| | Volume (ml.) | Active Amount (g.) | Percent by Weight Based on 100% $HNO_3$ |
|---|---|---|---|
| Nitric Acid (42° Baumé) | 350 | 331 | ---------- |
| Water | 1,860 | ---------- | ---------- |
| Kerosene | 170 | ---------- | ---------- |
| Sodium 7-ethyl-2-methyl-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table VII*

| Lateral Loss in Line Width (Inch) | Etch Depth (Inch) | Etch Factor |
|---|---|---|
| 0.0006 | 0.0133 | 44.2 |
| 0.0008 | 0.0134 | 33.5 |
| 0.0006 | 0.0134 | 44.7 |
| 0.0013 | 0.0135 | 20.8 |
| 0.0010 | 0.0133 | 26.6 |
| 0.0009 | 0.0134 | 29.8 |

The edges of the etch were clean and free from undercutting. There was good base buildup below the image.

To the above bath, which was not exhausted, was added 11 ml. of a 5% aqueous solution of Areskap 100 (monobutyl phenyl phenol sodium sulfonate 100% active). An identical plate was prepared and etched with this bath, with the following results:

*Table VIII*

| Lateral Loss in Line Width (Inch) | Etch Depth (Inch) | Etch Factor |
|---|---|---|
| 0.0004 | 0.0136 | 68.0 |
| 0.0006 | 0.0135 | 45.0 |
| 0.0005 | 0.0137 | 54.8 |
| 0.0004 | 0.0136 | 68.0 |
| 0.0004 | 0.0137 | 68.5 |
| 0.0005 | 0.0135 | 54.0 |

The improvement in etch factor is apparent. The edges of the etch were clean and free from undercutting. The base buildup was excellent, and the sidewalls were of optimum configuration, superior to that of the plate etched with the first bath.

To the above bath, which was still not exhausted, was added an additional 4 ml. of the 5% solution of Areskap 100, and the bath used again to etch a zinc alloy plate as before. The following data was noted:

*Table IX*

| Lateral Loss in Line Width (Inch) | Etch Depth (Inch) | Etch Factor |
|---|---|---|
| 0.0002 | 0.0128 | 128 |
| 0.0003 | 0.0130 | 86.7 |
| 0.0002 | 0.0129 | 129 |
| 0.0003 | 0.0131 | 87.3 |
| 0.0003 | 0.0130 | 86.7 |
| 0.0002 | 0.0130 | 130 |

It is apparent that an even greater improvement in etch factor is obtainable using the relatively larger amount of Areskap 100. Using 15 ml. instead of 11 ml., the lateral loss is reduced to one-third or less than that obtained without the Areskap.

EXAMPLE 6

An etching bath was prepared of the following composition:

| | Volume (ml.) | Active Amount (g.) | Percent by Weight Based on 100% $HNO_3$ |
|---|---|---|---|
| Nitic Acid (42° Baumé) | 350 | 331 | ---------- |
| Water | 1,860 | ---------- | ---------- |
| Kerosene | 170 | ---------- | ---------- |
| Sodium 7-ethyl-2-methyl-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table X*

| Lateral Loss in Line Width (Inch) | Etch Depth (Inch) | Etch Factor |
|---|---|---|
| 0.0007 | 0.0132 | 37.7 |
| 0.0006 | 0.0131 | 43.7 |
| 0.0006 | 0.0132 | 44.0 |
| 0.0009 | 0.0130 | 28.9 |
| 0.0008 | 0.0131 | 32.8 |
| 0.0008 | 0.0132 | 33.0 |

The edges of the etch were clean and free from undercutting. There was good base buildup below the image.

To the above bath, which was not exhausted, was added 13 ml. of a 3.4% aqueous solution of Aresklene (dibutyl phenyl phenol sodium disulfonate, 75% active).

An identical plate was prepared and etched with this bath, with the following results:

*Table XI*

| Lateral Loss in Line Width (Inch) | Etch Depth (Inch) | Etch Factor |
|---|---|---|
| 0.0002 | 0.0134 | 134 |
| 0.0004 | 0.0137 | 68.5 |
| 0.0003 | 0.0137 | 91.3 |
| 0.0004 | 0.0138 | 69.0 |
| 0.0003 | 0.0139 | 93.7 |
| 0.0003 | 0.0138 | 92.0 |

The improvement in etch factor is apparent. The edges of the etch were clean and free from undercutting. The base buildup was excellent, and the sidewalls were of optimum configuration, superior to that of the plate etched with the first bath.

EXAMPLE 7

An etching bath was prepared of the following composition:

| | Volume (ml.) | Active Amount (g.) | Percent by Weight Based on 100% $HNO_3$ |
|---|---|---|---|
| Nitric Acid (42° Baumé) | 350 | 331 | |
| Water | 1,840 | | |
| Kerosene | 170 | | |
| Sodium 7-ethyl-2-methyl-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table XII*

| Lateral Loss in Line Width (Inch) | Etch Depth (Inch) | Etch Factor |
|---|---|---|
| 0.0007 | 0.0136 | 38.9 |
| 0.0006 | 0.0137 | 45.7 |
| 0.0007 | 0.0137 | 39.1 |
| 0.0007 | 0.0136 | 38.9 |
| 0.0008 | 0.0135 | 33.8 |
| 0.0009 | 0.0137 | 30.4 |

The edges of the etch were clean and free from undercutting. There was good base buildup below the image.

To the above bath, which was not exhausted, was added 25 ml. of a 2.3% aqueous solution of Santomerse 80 (sodium dodecyl benzene sulfonate, 80% active). An identical plate was prepared and etched with this bath, with the following results:

*Table XIII*

| Lateral Loss in Line Width (Inch) | Etch Depth (Inch) | Etch Factor |
|---|---|---|
| 0.0004 | 0.0129 | 64.5 |
| 0.0002 | 0.0126 | 126 |
| 0.0002 | 0.0128 | 128 |
| 0.0002 | 0.0128 | 128 |
| 0.0003 | 0.0129 | 86.0 |
| 0.0003 | 0.0130 | 86.7 |

The improvement in etch factor is apparent. The edges of the etch were clean and free from undercutting. The base buildup was excellent, and the sidewalls were of optimum configuration, superior to that of the plate etched with the first bath.

EXAMPLE 8

An etching bath was prepared of the following composition:

| | Volume (ml.) | Active Amount (g.) | Percent by Weight Based on 100% $HNO_3$ |
|---|---|---|---|
| Nitric Acid (42° Baumé) | 350 | 331 | |
| Water | 1,860 | | |
| Kerosene | 170 | | |
| Sodium 7-ethyl-2-methyl-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table XIV*

| Lateral Loss in Line Width (Inch) | Etch Depth (Inch) | Etch Factor |
|---|---|---|
| 0.0006 | 0.0138 | 46.0 |
| 0.0007 | 0.0136 | 39.1 |
| 0.0007 | 0.0139 | 39.7 |
| 0.0008 | 0.0136 | 34.0 |
| 0.0006 | 0.0137 | 45.7 |
| 0.0007 | 0.0139 | 39.7 |

The edges of the etch were clean and free from undercutting. There was good base buildup below the image.

To the above bath, which was not exhausted, was added 5 ml. of a 5% aqueous solution of Sorbit P (butyl naphthalene sodium sulfonate, 65% active). An identical plate was prepared and etched with this bath, with the following results:

*Table XV*

| Lateral Loss in Line Width (Inch) | Etch Depth (Inch) | Etch Factor |
|---|---|---|
| 0.0003 | 0.0142 | 94.7 |
| 0.0003 | 0.0143 | 95.3 |
| 0.0003 | 0.0143 | 95.3 |
| 0.0004 | 0.0142 | 71.0 |
| 0.0003 | 0.0141 | 94.0 |
| 0.0003 | 0.0144 | 96.0 |

The improvement in etch factor is apparent. The edges of the etch were clean and free from undercutting. The base buildup was excellent, and the sidewalls were of optimum configuration, superior to that of the plate etched with the first bath.

EXAMPLE 9

An etching bath was prepared of the following composition:

| | Volume (ml.) | Active Amount (g.) | Percent by Weight Based on 100% $HNO_3$ |
|---|---|---|---|
| Nitric Acid (42° Baumé) | 350 | 331 | |
| Water | 1,870 | | |
| Kerosene | 170 | | |
| Sodium 7-ethyl-2-methyl-undecane-4-sulfate (25% aqueous solution) | 3.75 | 0.983 | 0.297 |
| Surfynol 104E (50% solution in ethylene glycol by weight) | 1.25 | 0.613 | 0.185 |

A sensitized zinc alloy plate (zinc with alloyed aluminum and magnesium) coated with a light-sensitive resist composition, was exposed under a line image at 3½ feet from a 75 ampere white flame carbon arc for about 2 minutes. The result of the exposure was to insolubilize the resist in the exposed region in the 50–50 mixture of methyl ethyl ketone and acetone used in the development. After exposure, development was carried out for 2 minutes in a tray of 50% methyl ethyl ketone and 50% acetone, dissolving the light-unexposed soluble areas of the plate and leaving a resin.

The plate was then ready for etching in order to obtain a letterpress relief plate. The plate was scummed out in dilute nitric acid solution, rinsed and then etched in the etching bath, using a miniature splash-etching machine for a total of 5 minutes at 700 R. P. M. The plate was then removed from the bath, rinsed and dried. The following data was noted:

*Table XVI*

| Lateral Loss in Line Width (Inch) | Etch Depth (Inch) | Etch Factor |
|---|---|---|
| 0.0008 | 0.0146 | 36.5 |
| 0.0008 | 0.0147 | 32.7 |
| 0.0009 | 0.0144 | 32.0 |
| 0.0008 | 0.0146 | 36.5 |
| 0.0007 | 0.0148 | 41.3 |
| 0.0008 | 0.0145 | 36.2 |

The edges of the etch were clean and free from undercutting. There was good base buildup below the image.

To the above bath, which was not exhausted, was added 1.2 ml. of Rueterg 97–S (monoethanolamine dodecyl benzene sulfonate, 44% aqueous solution). An identical plate was prepared and etched with this bath, with the following results:

*Table XVII*

| Lateral Loss in Line Width (Inch) | Etch Depth (Inch) | Etch Factor |
|---|---|---|
| 0.0004 | 0.0147 | 73.5 |
| 0.0004 | 0.0148 | 74.0 |
| 0.0005 | 0.0145 | 58.0 |
| 0.0004 | 0.0148 | 74.0 |
| 0.0005 | 0.0147 | 58.8 |
| 0.0004 | 0.0146 | 73.0 |

To the above bath, which was still not exhausted, was added an additional 0.2 ml. of Rueterg 97–S, and the bath used again to etch a zinc alloy plate as before. The following data was noted:

*Table XVIII*

| Lateral Loss in Line Width (Inch) | Etch Depth (Inch) | Etch Factor |
|---|---|---|
| 0.0002 | 0.0144 | 144 |
| 0.0003 | 0.0146 | 97.3 |
| 0.0003 | 0.0147 | 98.0 |
| 0.0003 | 0.0145 | 96.7 |
| 0.0003 | 0.0146 | 97.3 |
| 0.0003 | 0.0148 | 98.7 |

The improvement in etch factor is increased further by the additional amount of Rueterg 97–S. The edges of the etch both in this plate and in the plate before were clean and free from undercutting. The base build-up was excellent, and the sidewalls were of optimum configuration, superior to that of the plate etched with the first bath which did not contain the Rueterg 97–S.

In the claims, the percentages of the wetting agents are by weight of the nitric acid, calculated as $HNO_3$, and the percentage of the petroleum fraction is by volume of the nitric acid solution.

We claim:

1. An etching bath comprising an aqueous dispersion containing nitric acid, from 1 to 75% of a water-immiscible liquid petroleum fraction boiling in the range from 70 to 390° C., from 0.2 to 2.5% of a water-soluble salt of a tetradecyl sulfate, from 0.05 to 2.5% of a 1,1,4,4-tetraalkyl-2-butyne-1,4-diol having the formula:

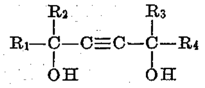

in which $R_1$ and $R_4$ are selected from the group consisting of alkyl radicals having from four to fourteen carbon atoms, and $R_2$ and $R_3$ are selected from the group consisting of alkyl radicals having from one to five carbon atoms, and from 0.015 to 0.75% of an alkyl aryl sulfonate having the formula:

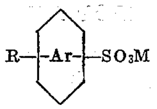

where R is a hydrocarbon radical aggregating from two to about eighteen carbon atoms,

is an aromatic carbocyclic ring nucleus having from six to ten carbon atoms and M is selected from the group consisting of hydrogen, alkali metal and organic amine cations.

2. An etching bath in accordance with claim 1 in which the tetradecyl sulfate is sodium 7-ethyl-2-methyl-undecane-4-sulfate.

3. An etching bath in accordance with claim 1 in which the petroleum fraction is kerosene.

4. An etching bath in accordance with claim 1 in which the 2-butyne diol is

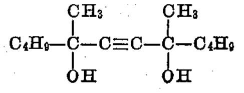

5. An etching bath in accordance with claim 1 in which the 2-butyne diol is

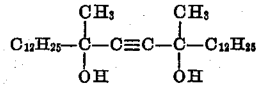

6. An etching bath in accordance with claim 1 in which the 2-butyne diol is

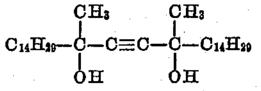

7. An etching bath in accordance with claim 1 in which the alkyl aryl sulfonate is an alkyl benzene sulfonate wherein the alkyl radical has from two to eighteen carbon atoms.

8. An etching bath in accordance with claim 1 in which the alkyl benzene sulfonate is sodium dodecyl benzene sulfonate.

9. An etching bath in accordance with claim 1 in which the alkyl benzene sulfonate is sodium xylene sulfonate.

10. An etching bath in accordance with claim 1 in which the alkyl benzene sulfonate is sodium keryl benzene sulfonate.

11. An etching bath in accordance with claim 1 in which the alkyl aryl sulfonate is an alkyl naphthalene sulfonate in which the alkyl radical has from two to eighteen carbon atoms.

12. An etching bath in accordance with claim 11 in which the alkyl naphthalene sulfonate is sodium butyl naphthalene sulfonate.

13. An etching bath comprising an aqueous dispersion containing from 3 to 25% nitric acid, from 5 to 25% of a water-immiscible liquid petroleum fraction boiling in the range from 70 to 390° C., from 0.2 to 0.8% of a water-soluble salt of a tetradecyl sulfate, from 0.05 to 1.5% of a 1,1,4,4-tetraalkyl-2-butyne-1,4-diol having the formula:

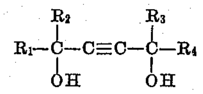

in which $R_1$ and $R_4$ are selected from the group consisting of alkyl radicals having from four to fourteen carbon atoms, and $R_2$ and $R_3$ are selected from the group consisting of alkyl radicals having from one to five carbon atoms, and from 0.02 to 0.45% of an alkyl aryl sulfonate having the formula:

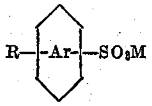

where R is a hydrocarbon radical aggregating from two to about eighteen carbon atoms,

is an aromatic carbocyclic ring nucleus having from six to ten carbon atoms and M is selected from the group consisting of hydrogen, alkali metal and organic amine cations.

14. A process for etching the exposed metal areas of developed metallic printing plates coated in selected areas with a protective resist which comprises subjecting the plate to the action of an etching bath in accordance with claim 1.

15. A process in accordance with claim 14 in which the metallic printing plate is a zinc alloy plate.

16. A process in accordance with claim 14 in which the metallic printing plate is a magnesium alloy plate.

17. A concentrate adapted to form an improved etching bath when combined with an aqueous nitric acid etching solution, comprising a water-soluble salt of a tetradecyl sulfate, a 1,1,4,4-tetraalkyl-2-butyne-1,4-diol having the formula:

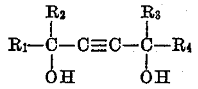

in which $R_1$ and $R_4$ are selected from the group consisting of alkyl radicals having from four to fourteen carbon atoms, and $R_2$ and $R_3$ are selected from the group consisting of alkyl radicals having from one to five carbon atoms, an alkyl aryl sulfonate having the formula:

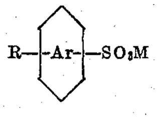

where R is a hydrocarbon radical aggregating from two to about eighteen carbon atoms,

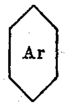

is an aromatic carbocyclic ring nucleus having from six to ten carbon atoms and M is selected from the group consisting of hydrogen, alkali metal and organic amine cations, and a water-immiscible liquid petroleum fraction boiling in the range from 70° to 390° C., the aforesaid components being in proportions to give when combined with the aqueous nitric acid etching solution a final etching bath comprising from 0.2 to 2.5% of the tetradecyl sulfate, from 0.05 to 2.5% of the 1,1,4,4-tetraalkyl-2-butyne-1,4-diol, from 0.015 to 0.75% of the alkyl aryl sulfonate and from 1 to 75% of the petroleum fraction.

18. A concentrate in accordance with claim 17 in which the tetradecyl sulfate is sodium 7-ethyl-2-methyl-undecane-4-sulfate.

19. A concentrate in accordance with claim 17 in which the petroleum fraction is kerosene.

References Cited in the file of this patent

UNITED STATES PATENTS

| | | |
|---|---|---|
| 2,261,700 | Ryznar | Nov. 4, 1941 |
| 2,371,646 | Petering | Mar. 20, 1945 |
| 2,447,475 | Kaberg | Aug. 17, 1948 |
| 2,546,167 | Salvin | Mar. 27, 1951 |
| 2,640,765 | Easley et al. | June 2, 1953 |
| 2,763,536 | Easley et al. | Sept. 18, 1956 |